United States Patent
Zechmann et al.

(10) Patent No.: US 10,256,149 B2
(45) Date of Patent: Apr. 9, 2019

(54) SEMICONDUCTOR WAFER DICING CRACK PREVENTION USING CHIP PERIPHERAL TRENCHES

(71) Applicant: Infineon Technologies Austria AG, Villach (AT)

(72) Inventors: Arno Zechmann, Villach (AT); Gianmauro Pozzovivo, Sattendorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/444,386

(22) Filed: Feb. 28, 2017

(65) Prior Publication Data

US 2018/0247869 A1  Aug. 30, 2018

(51) Int. Cl.
| | | |
|---|---|---|
| *H01L 21/78* | (2006.01) | |
| *H01L 29/04* | (2006.01) | |
| *H01L 23/00* | (2006.01) | |
| *H01L 29/778* | (2006.01) | |
| *H01L 29/06* | (2006.01) | |
| *H01L 23/544* | (2006.01) | |
| *H01L 29/66* | (2006.01) | |

(52) U.S. Cl.
CPC ............ *H01L 21/78* (2013.01); *H01L 23/544* (2013.01); *H01L 23/562* (2013.01); *H01L 29/045* (2013.01); *H01L 29/0649* (2013.01); *H01L 29/6609* (2013.01); *H01L 29/66462* (2013.01); *H01L 29/7783* (2013.01); *H01L 2223/54453* (2013.01)

(58) Field of Classification Search
None
See application file for complete search history.

(56) References Cited

U.S. PATENT DOCUMENTS

| | | | |
|---|---|---|---|
| 8,975,696 B2 | 3/2015 | Haeberlen et al. | |
| 9,263,545 B2 | 2/2016 | Ostermaier et al. | |
| 2005/0118790 A1 | 6/2005 | Lee et al. | |
| 2007/0210327 A1 | 9/2007 | Ikeda et al. | |
| 2011/0204488 A1* | 8/2011 | Itou .......................... | H01L 21/78 257/622 |

FOREIGN PATENT DOCUMENTS

| | | |
|---|---|---|
| DE | 102012111830 A1 | 6/2013 |
| EP | 1973174 A2 | 9/2008 |

OTHER PUBLICATIONS

Lei, Wei-Sheng, "Die Singulation Technologies for Advanced Packaging", Journal of Vacuum Science & Technology B, vol. 30, No. 4, Jul. 2012, 1-28.

\* cited by examiner

*Primary Examiner* — Long Pham
(74) *Attorney, Agent, or Firm* — Murphy, Bilak & Homiller, PLLC

(57) ABSTRACT

A semiconductor base substrate having a substantially planar growth surface is provided. A first type III-V semiconductor layer is epitaxially grown on the growth surface. First and second trenches that vertically extend from an upper surface of the first type III-V semiconductor layer at least to the growth surface are formed. The first and second trenches are filled with a filler material that is different from material of the type III-V semiconductor layer. A cut that separates the first type III-V semiconductor layer and the base substrate into two discrete semiconductor chips is formed. The cut is formed in a lateral section of the first type III-V semiconductor layer that is between the first and second trenches.

16 Claims, 15 Drawing Sheets

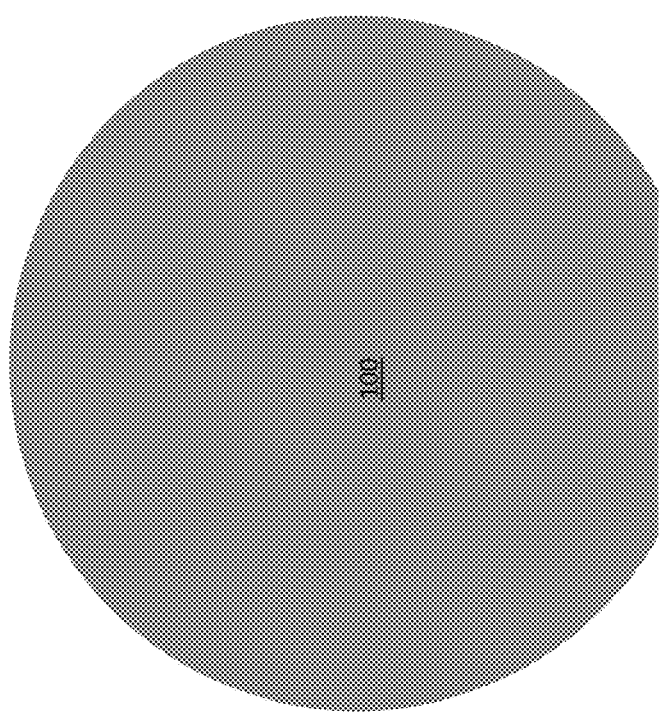
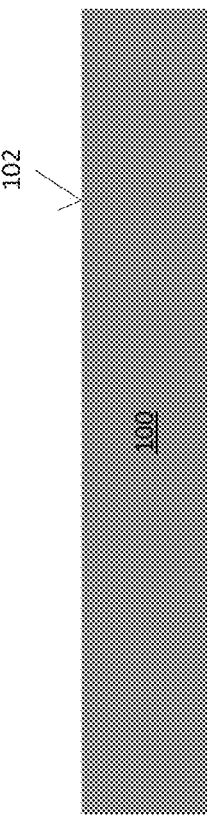
FIG. 1A
FIG. 1B

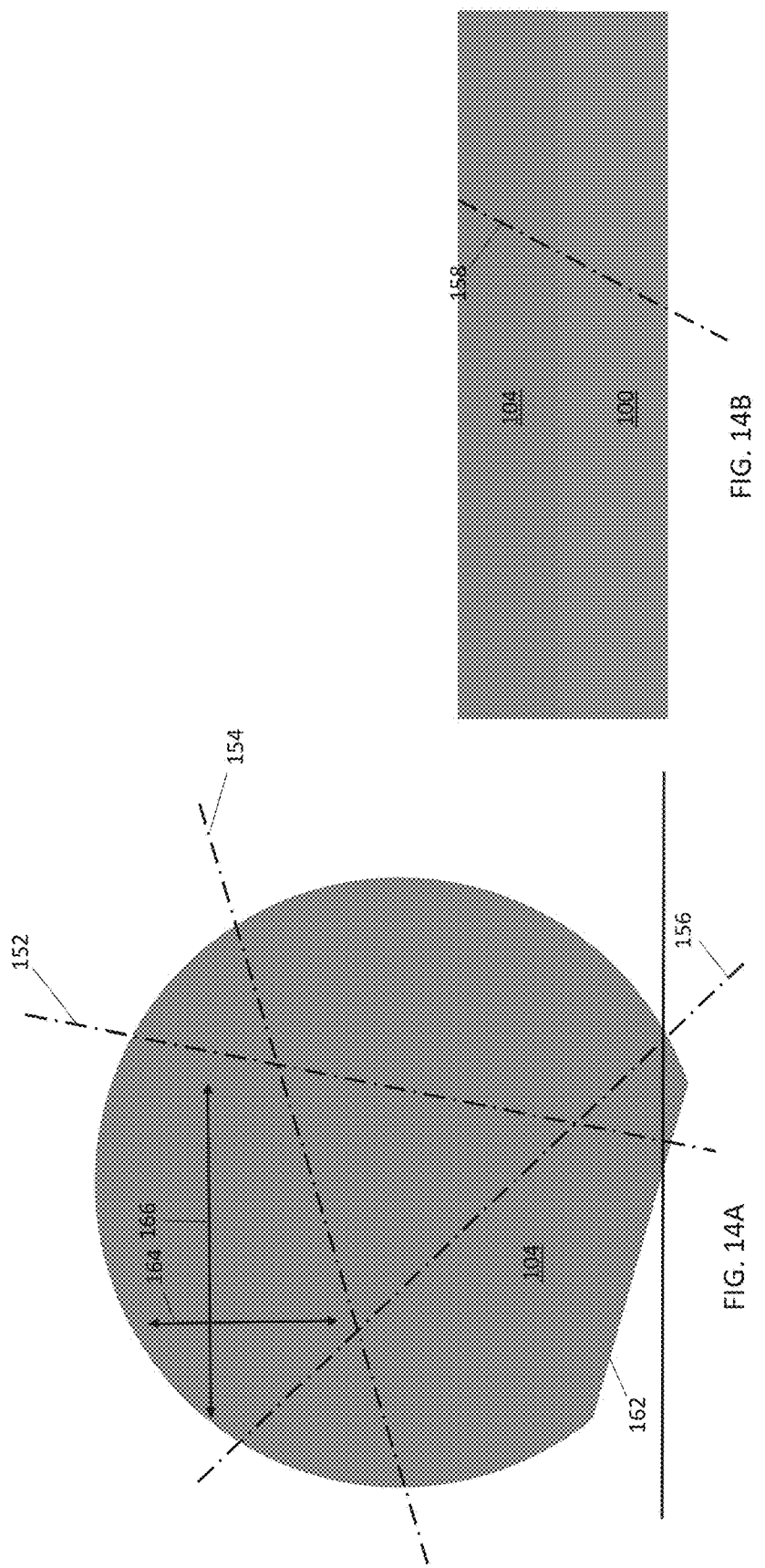

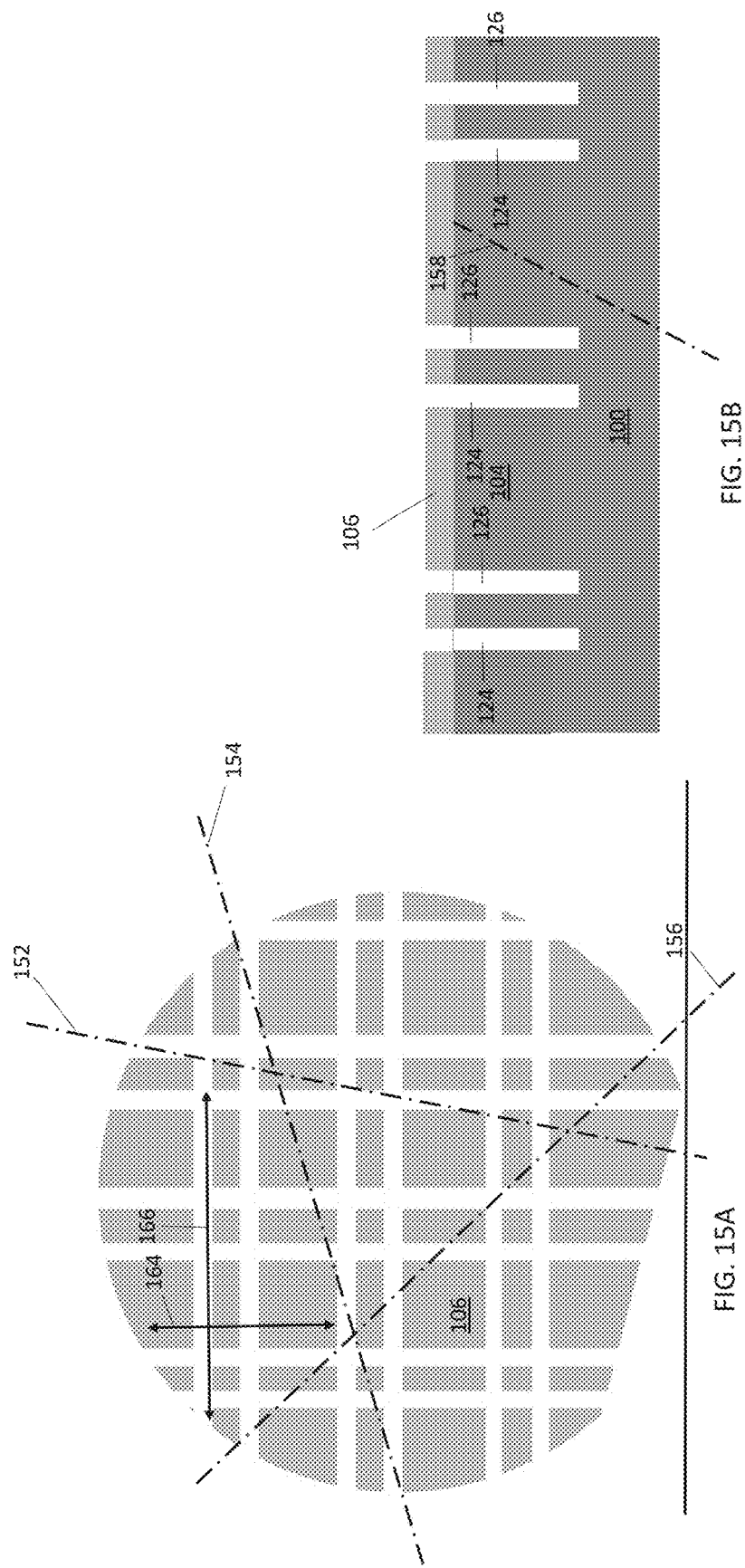

SEMICONDUCTOR WAFER DICING CRACK PREVENTION USING CHIP PERIPHERAL TRENCHES

TECHNICAL FIELD

The present application relates to semiconductor device fabrication, and in particular relates to wafer dicing.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. HEMTs are preferred in many applications due to their favorable power density, on-state resistance, switching frequency, and efficiency benefits over conventional silicon based transistors. HEMTs are typically formed using type III-V semiconductor materials, such as GaN, GaAs, InGaN, AlGaN, etc.

One common technique for HEMT device formation involves an epitaxy process. According to this technique, a bulk wafer is provided. Typically, the bulk wafer includes a readily available semiconductor material, such as silicon or silicon carbide. Type III-V semiconductor material is then grown on a growth surface of the wafer using an epitaxial growth technique. The growth surface of the wafer can be aligned with the <111> crystallographic plane of the wafer crystal so as to provide a hexagonal lattice surface for the epitaxial growth of the type III-V semiconductor material thereon. Once the type III-V material is epitaxially grown, device formation (e.g., gate structuring, contact formation, etc.) is performed in the type III-V semiconductor layer. After completion of the front-end-of-the-line and back-end-of-the-line processing, the wafers are singulated (i.e., cut) into a plurality of semiconductor dies.

One notable challenge in the fabrication of HEMT devices using the above described epitaxial growth processes relates to breaking and/or cracking of the substrate. Because the growth surface of the base substrate includes the <111> crystallographic plane, the base substrate is quite prone to cleavage. Thus, the application of moderate mechanical force to the base substrate, which may be the result of unavoidable processing steps, e.g., wafer handling, may cause the base substrate to partially or completely break.

Another notable challenge in the fabrication of HEMT devices using the above described epitaxial growth processes relates to chipping and breakage of the type III-V semiconductor during die singulation process. Known die singulation techniques include mechanical or laser dicing. Typically, a mechanical scribe line is used to define the chip areas on the wafer. Subsequently, mechanical sawing or a laser cutting is performed along the mechanical scribe line to separate the wafer into individual dies. However, due to the above described issues related to the mechanical strength of the wafer, there is a substantial risk of chip breakage during the cutting process. Moreover, the sawing process can cause cracks to propagate across the type III-V semiconductor layer, which can lead to device failure. Approaches to remove type III-V semiconductor material by separate etching steps prior to mechanical dicing are very complex and costly and may also lead to increase of particle contamination on the device. The type III-V semiconductor material can also be removed by laser processes prior to mechanical sawing, but this process can lead to a decrease in chip breakage strength.

SUMMARY

Those skilled in the art will recognize additional features and advantages upon reading the following detailed description, and upon viewing the accompanying drawings.

A method of forming a semiconductor device is disclosed. According to an embodiment of the method, a semiconductor base substrate having a substantially planar growth surface is provided. A first type III-V semiconductor layer is epitaxially grown on the growth surface. First and second trenches that vertically extend from an upper surface of the first type III-V semiconductor layer at least to the growth surface are formed. The first and second trenches are filled with a filler material that is different from material of the type III-V semiconductor layer. A cut that separates the first type III-V semiconductor layer and the base substrate into two discrete semiconductor chips is formed. The cut is formed in a lateral section of the first type III-V semiconductor layer that is between the first and second trenches.

According to another embodiment of the method, a wafer having a base substrate and a first type III-V semiconductor layer being formed on a growth surface of the base substrate is proved. Sets of spaced apart trenches are formed in the wafer. The sets of spaced apart trenches intersect with one another and enclose first lateral sections of the first type III-V semiconductor layer. Each of the sets of spaced apart trenches include first and second trenches that vertically extend from an upper surface of the first type III-V semiconductor layer at least to the growth surface and laterally extend parallel to one another. The wafer is separated into a plurality of semiconductor chips by cutting second lateral sections of the first type III-V semiconductor layer that are between the first and second trenches.

A semiconductor chip is disclosed. According to an embodiment, the semiconductor chip includes a semiconductor base substrate having a planar growth surface. A first type III-V semiconductor layer is formed on the growth surface. First, second, third and fourth trenches vertically extend from an upper surface of the first type III-V semiconductor layer at least to the growth surface. A filler material that is different from material of the type III-V semiconductor layer fills the first, second, third and fourth trenches. A central lateral section of the first type III-V semiconductor layer is enclosed by the first, second, third and fourth trenches. An outer lateral section of the first type III-V semiconductor layer that extends to an edge side of the semiconductor chip is physically decoupled from the central lateral section.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a semiconductor base substrate, according to an embodiment. FIG. 1A depicts the semiconductor base substrate from a plan view perspective and FIG. 1B depicts the semiconductor base substrate from a cross-sectional perspective.

FIGS. 12A and 12B, illustrates a semiconductor base substrate and the crystallographic planes of a <111> semiconductor base substrate, according to an embodiment. FIG. 12A depicts the semiconductor base substrate from a plan view perspective and FIG. 12B depicts the semiconductor base substrate from a cross-sectional perspective.

FIGS. 13A and 13B, illustrates the semiconductor base substrate being rotated such that the crystallographic planes of the <111> semiconductor base substrate are antiparallel and antiperpendicular to the trench length directions, according to an embodiment. FIG. 13A depicts the <111> semiconductor base substrate from a plan view perspective and FIG. 13B depicts the <111> semiconductor base substrate from a cross-sectional perspective.

FIG. 14, which includes FIGS. 14A and 14B, illustrates the <111> semiconductor base substrate with a first type III-V semiconductor layer being formed after rotation of the <111> semiconductor base substrate, according to an embodiment. FIG. 14A depicts the <111> semiconductor base substrate from a plan view perspective and FIG. 14B depicts the <111> semiconductor base substrate from a cross-sectional perspective.

FIG. 15, which includes FIGS. 15A and 15B, illustrates the <111> semiconductor base substrate with first and second trenches that are formed after rotation of the <111> semiconductor base substrate, according to an embodiment. FIG. 15A depicts the <111> semiconductor base substrate from a plan view perspective and FIG. 15B depicts the <111> semiconductor base substrate from a cross-sectional perspective.

DETAILED DESCRIPTION

Figure 2:
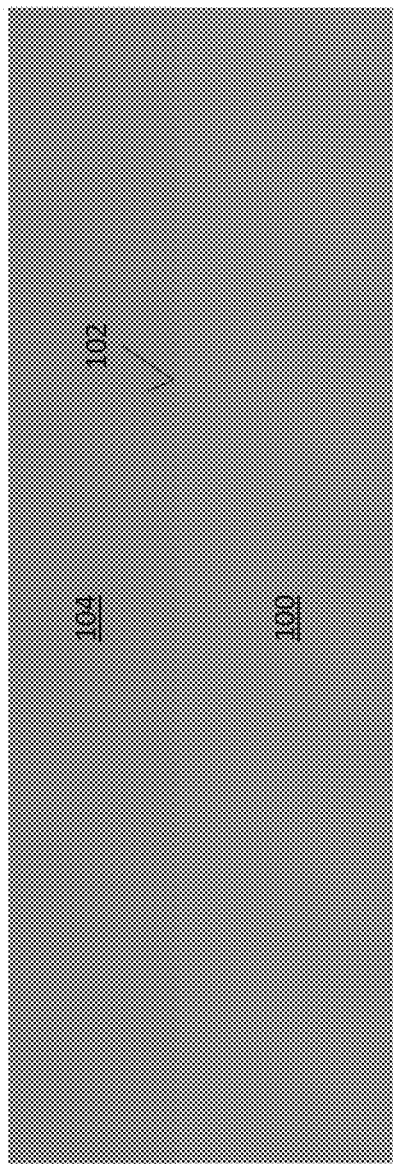
FIG. 2 depicts a first type III-V semiconductor layer formed on the semiconductor base substrate from a cross-sectional perspective, according to an embodiment.

According to embodiments described herein, crack stopping trenches are used to prevent cracks from propagating into the active area of semiconductor dies during the die singulation process. The crack stopping trenches are formed in an type III-V semiconductor layer that is epitaxially grown on a base substrate. The crack prevention trenches are formed around the periphery of the die areas in the shape of a dicing pattern. Before formation of semiconductor devices in the die portions of the type III-V semiconductor layer, the crack stopping trenches are filled with a filler material that is different from the type III-V semiconductor material. After front-end-of-the-line and back-end-of-the-line processing is completed, a simple, low-cost mechanical sawing process is performed in the dicing region between two crack stopping trenches to singulate the wafer into individual semiconductor chips. This sawing process may induce cracks in the type III-V semiconductor layer.

Advantageously, the crack stopping trenches prevent any cracks that may arise in the type III-V semiconductor layer during the die singulation process from reaching the active devices in the semiconductor dies. The crack stopping trenches can advantageously implemented at low cost with minimal processing steps. Moreover, the crack stopping trenches enable a low cost die singulation technique with minimal preparatory steps (e.g., etching) without creating an unacceptably high defect rate due to cracking. According to certain advantageous embodiments, the trenches can additionally provide functionality in the completed semiconductor devices. For instance, the crack stopping trenches can be configured as diodes or electrical connectors that are electrically connected to the active semiconductor devices. In other embodiments, the crack stopping trenches can be configured as electrical isolation trenches.

According to one embodiment, a wafer orientation technique is performed prior to trench formation. This wafer orientation technique ensures that the crack stopping trenches are not aligned with a preferred cleavage plane of the base substrate and consequently improves the mechanical strength of the wafers. One example of this technique involves using a physical indicator feature on the base substrate to determine the <101>, <110>, and <011> crystallographic planes. The base substrate is rotated prior to trench formation such that, when the crack stopping trenches are formed, the crack stopping trenches are not parallel or perpendicular to the preferred crystallographic cleavage planes of the substrate, i.e., the <101>, <110> and <011> planes. That is, the sidewalls of the crack stopping trenches extend in a length direction that is not parallel or perpendicular to the <101>, <110> and <011> crystallographic planes of the substrate. As a result, the likelihood of substrate breakage along one of the preferred cleavage planes of the base substrate is substantially reduced.

Referring to FIG. 1, a semiconductor base substrate 100 is depicted. In general, the base substrate 100 can include any crystalline semiconductor material suitable for manufacturing semiconductor devices, and in certain embodiments can include any material suitable for the epitaxial growth of a type III-V semiconductor material thereon. Exemplary materials for base substrate 100 include silicon (Si), group IV compound semiconductor materials such as silicon carbide (SiC) or silicon germanium (SiGe). Alternatively, the base substrate 100 can include a type III-V semiconductor including gallium nitride, gallium arsenide (GaAs), aluminium nitride (AlN), aluminium arsenide (AlAs), indium nitride (InN), indium arsenide (InAs), etc. The base substrate 100 can be a commercially available semiconductor wafer. According to an embodiment, the base substrate 100 is a silicon bulk substrate with a substantially planar growth surface 102 that exposes the <111> crystallographic plane of the silicon material.

Referring to FIG. 2, a first type III-V semiconductor layer 104 is formed on the growth surface 102 of the semiconductor base substrate 100. Generally speaking, the first type III-V semiconductor layer 104 can include any type III-V semiconductor material that is suitable for power semiconductor devices such as HEMTs. Exemplary materials for the first type III-V semiconductor layer 104 include gallium nitride (GaN), gallium arsenide (GaAs), aluminium nitride (AlN), aluminium arsenide (AlAs), indium nitride (InN), indium arsenide (InAs), etc. The first type III-V semiconductor layer 104 can also include ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc. The first type III-V semiconductor layer 104 can be formed using a conventionally known epitaxy process in which the crystalline structure of the exposed surface is used as a template for the successive deposition of a number of epitaxial layers thereon. Optionally, a lattice transition layer (not shown) may be provided between the base substrate 100 and the first type III-V semiconductor layer 104 to reduce lattice mismatch between the two regions. The lattice transition layer can be a III-V semiconductor-metal alloy (e.g., AlGaN) with a gradually diminishing metal content, for example.

The first type III-V semiconductor layer 104 can include a heterojunction in which two III-V semiconductor regions having different bandgaps (e.g., GaN and AlGaN) adjoin one another so as to form a two-dimensional carrier gas (e.g., a 2 DEG). This two-dimensional carrier gas can be used to form a high mobility channel for a power semiconductor device.

Figure 3:
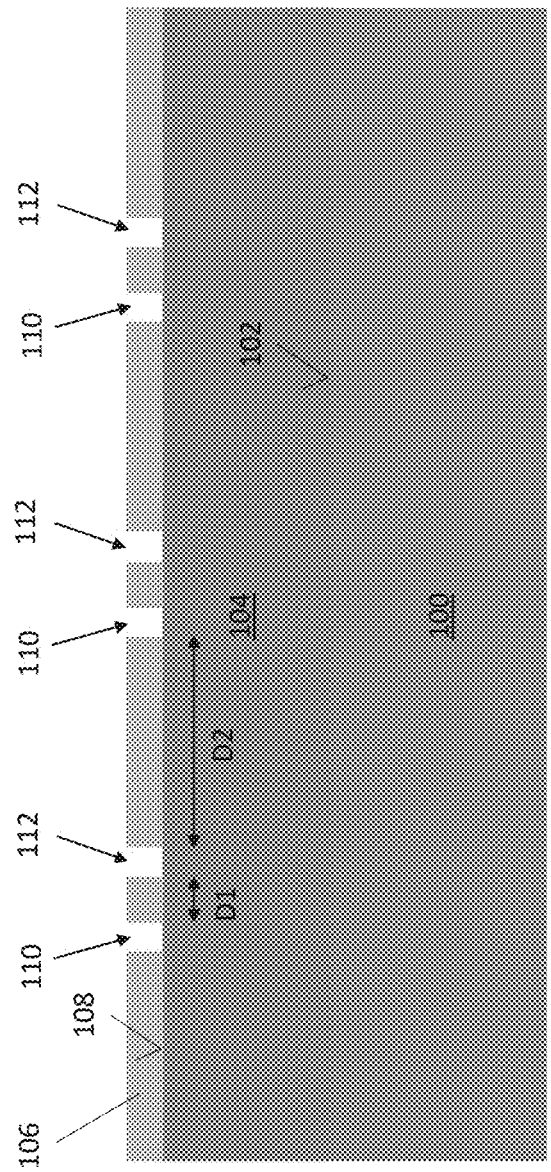
FIG. 3 depicts a patterned lithography mask formed on the first type III-V semiconductor layer from a cross-sectional perspective, according to an embodiment.

Referring to FIG. 3, a lithography mask 106 is formed on an upper surface 108 of the first type III-V semiconductor layer 104. Generally speaking, the lithography mask 106 can include any kind of photoresist material that is compatible with photolithography. The lithography mask 106 has been patterned with first and second openings 110, 112 that expose the upper surface 108 of the first type III-V semiconductor layer 104 from the lithography mask 106. The first and second openings 110, 112 are spaced apart from one another by a first distance D1. Each of the sets of the first and second openings 110, 112 are spaced apart from one another by a second distance D2. According to an embodiment, the second distance D2 is greater than the first distance D1.

Figure 4:
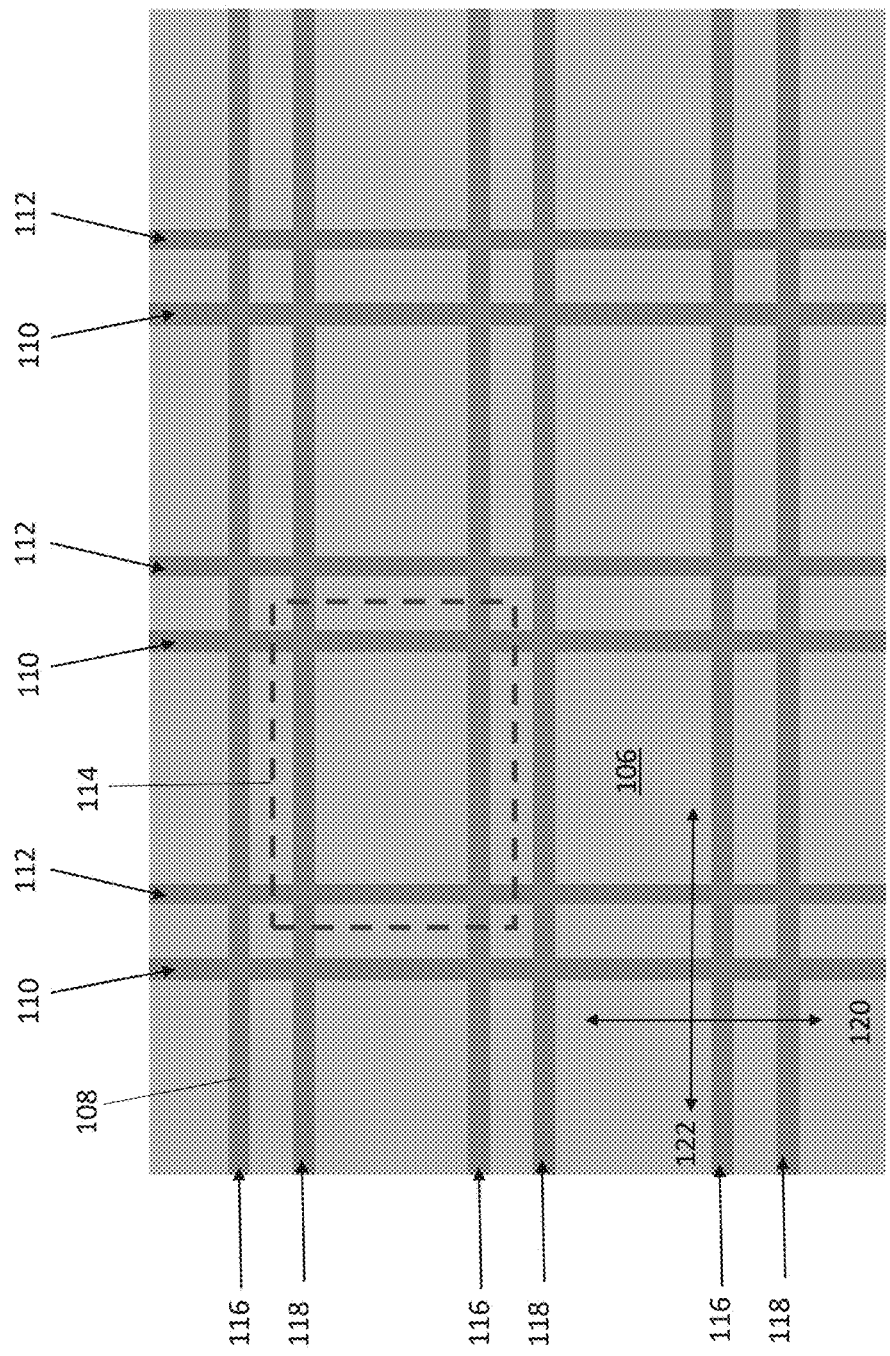
FIG. 4 depicts the patterned lithography mask formed on the first type III-V semiconductor layer from a plan view perspective, according to an embodiment.

Referring to FIG. 4, a plan view of the wafer with the lithography mask 106 is depicted. FIG. 4 is a close up view that does not show the outer lateral edges of the wafer. The pattern shown in FIG. 4 can be repeated up to the outer lateral edges of the wafer. The lithography mask 106 has been patterned such that the openings in the lithography mask 106 have the shape of a dicing pattern for a semiconductor wafer. A peripheral edge 114 of each die is defined by the first and second openings 110, 112 and third and fourth openings 116, 118 that intersect with the first and second openings 110, 112.

In general, the sets of the first, second, third and fourth openings 110, 112, 116, 118 can be patterned to form any desired geometry for the peripheral edge 114 of the dies. According to a particular embodiment, the third and fourth openings 116, 118 are spaced apart from one another by the first distance D1, i.e., the same distance that separates the first and second openings 110, 112 from one another, and each set of the third and fourth openings 116, 118 is spaced apart from one another by the second distance D2, i.e., the same distance between sets of the first and second openings 110, 112. Additionally, the first and second openings 110, 112 extend along a first trench length direction 120 and the third and fourth openings 116, 118 extend along a second trench length direction 122 that is perpendicular to the first trench length direction 120. As a result, a square dicing pattern is provided.

Figure 5:
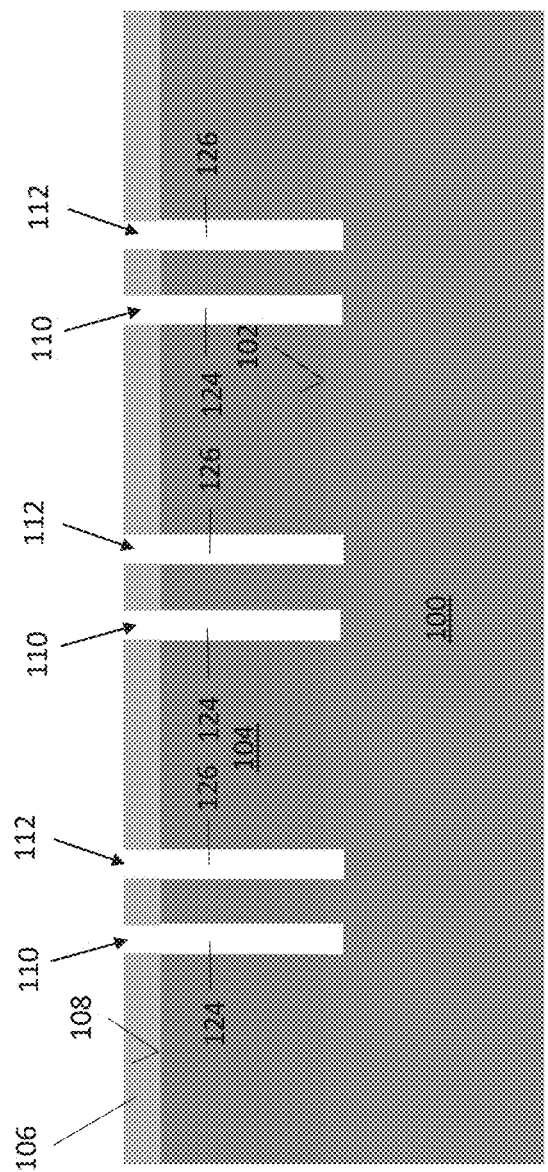
FIG. 5 depicts first and second trenches being formed in the first type III-V semiconductor layer from a cross-sectional perspective, according to an embodiment.

Referring to FIG. 5, first and second trenches 124, 126 are formed in the type III-V semiconductor layer 104. The first and second trenches 124, 126 are formed by an etching process in which semiconductor material that is exposed from the first and second openings 110, 112 of the lithography mask 106 is removed from the first type III-V semiconductor layer 104. In general, this etching process can include any conventionally known etching technique, e.g., wet, dry, plasma, anisotropic, etc.

From a plan view perspective of the wafer, the first and second trenches 124, 126 have the geometry of the first and second openings 110, 112 illustrated in FIG. 4. That is, the sidewalls of the first and second trenches 124, 126 extend along the first trench length direction 120. Third and fourth trenches (not shown), which correspond to the third and fourth openings 116, 118 and are formed by this etching process, extend along the second trench length direction 122 and intersect with the first and second trenches 124, 126.

The first and second trenches 124, 126 are formed to vertically extend from the upper surface 108 of the first type III-V semiconductor layer 104 at least to the growth surface 102 of the base substrate 100. That is, the etching process is carried out until all of the first type III-V semiconductor material is removed and the bottom of the first and second trenches 124, 126 reaches base substrate 100. In the depicted embodiment, the first and second trenches 124, 126 extend further into the base substrate 100 such that the bottom of the first and second trenches 124, 126 is beneath the growth surface 102.

Figure 6:
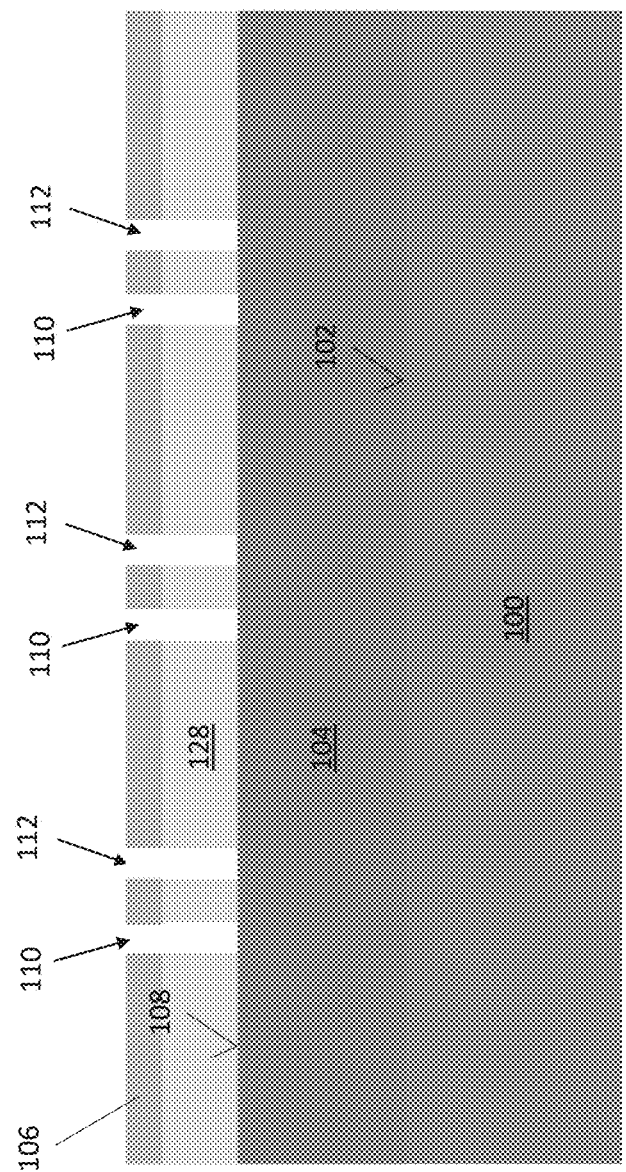
FIG. 6 depicts a hard mask and a patterned lithography mask formed on the first type III-V semiconductor layer from a cross-sectional perspective, according to an embodiment.
Figure 7:
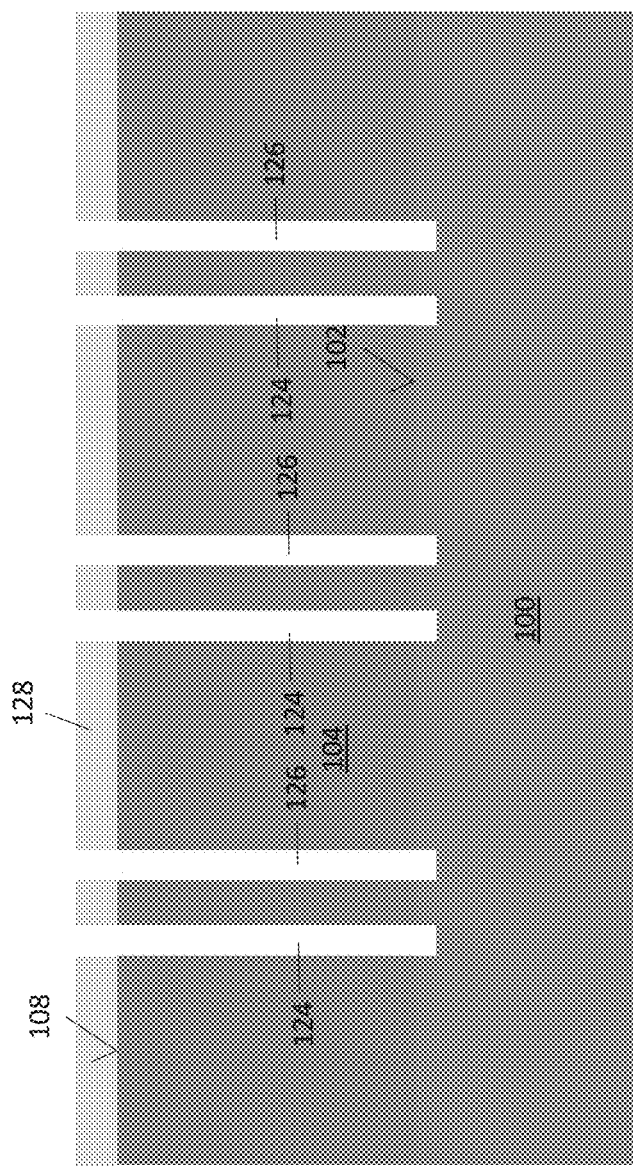
FIG. 7 depicts first and second trenches being formed in the first type III-V semiconductor layer from a cross-sectional perspective, according to another embodiment.

Referring to FIGS. 6-7, a method for forming the first and second trenches 124, 126 is depicted according to another embodiment. Different to the technique described with reference to FIGS. 3-5, according to this technique a first hard mask layer 128 is used in addition to the lithography mask 106. The first hard mask layer 128 can be formed from any material that is resistant to certain etchant materials. For example, the hard mask layer 128 can be an oxide layer, such as a layer of silicon dioxide ($SiO_2$). The first hard mask layer 128 is formed on the first type III-V semiconductor layer 104 after the epitaxial growth step. After forming the hard mask layer 128, the lithography mask 106 is formed on the hard mask layer 128. The lithography mask 106 can have the same composition and geometry as previously described with reference to FIGS. 3 and 4.

Referring to FIG. 6, after forming the lithography mask 106, a first etching step is performed to structure the hard mask layer 128 with a corresponding geometry as the lithography mask 106. This first etching step can a plasma etching step, for example. After the first etching step, the openings formed in the hard mask layer 128 expose the first type III-V semiconductor in with a patterned geometry, such as the patterned geometry shown in FIG. 4, for example.

Referring to FIG. 7, first and second trenches 124, 126 are formed in the type III-V semiconductor layer 104. In a similar manner as previously described, the first and second trenches 124, 126 can be formed by etching away exposed type III-V semiconductor material until the bottom of the first and second trenches 124, 126 reaches the base substrate 100. In general, this can etching process can include any conventionally known etching process, e.g., wet, dry, plasma, anisotropic, etc.

The technique described with reference to FIGS. 3-5 and the technique described with reference to FIGS. 6-7 provide different advantages. The technique described with reference to FIGS. 6-7 is better suited for deeper trench etching because the hard mask layer 128 protects the upper surface 108 of the type III-V semiconductor layer 104 during long etching cycles by providing a barrier against the etchant. If the etching process is sufficiently long, the technique described with reference to FIGS. 3-5 may not be suitable because the lithography mask 106 can be completely removed and the underlying type III-V semiconductor layer 104 becomes damaged. However, for shallower trench etching, the technique described with reference to FIGS. 3-5 is suitable and the extra hard mask and patterning steps of FIGS. 6-7 can be omitted.

Figure 8:
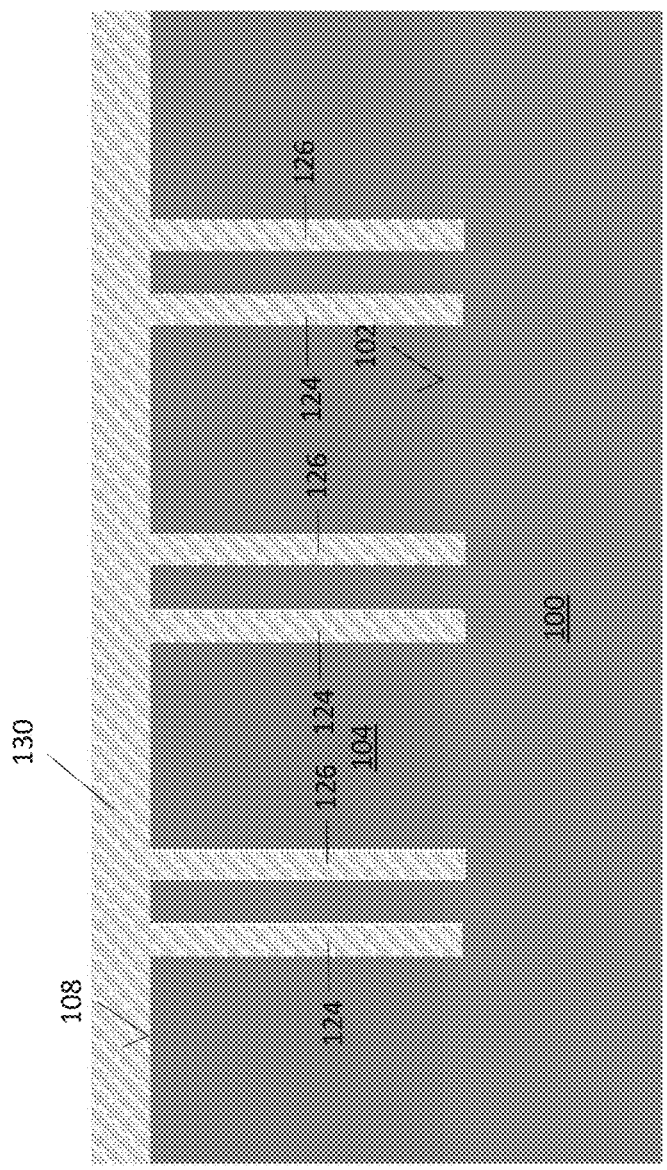
FIG. 8 depicts a filler material being formed in the first and second trenches from a cross-sectional perspective, according to an embodiment.

Referring to FIG. 8, after trenches are formed according to either one of the techniques described above, the first and second trenches 124, 126 are filled with a filler material 130. In general, the filler material 130 can be any material that is different from material of the type III-V semiconductor layer 104. Examples of the filler material 130 includes conductive materials, semiconducting materials, and electrical insulators. Exemplary conductive filler materials 130 include metals and metal alloys, such as tungsten, aluminum and alloys thereof. Exemplary semiconducting filler materials 130 include polycrystalline semiconductors such as polysilicon. These polycrystalline semiconductors can be intentionally doped to provide a desired conductivity. Exemplary electrical insulating filler materials 130 include semiconductor oxides such as silicon dioxide ($SiO_2$), silicon nitride (SiN) or silicon oxynitride ($SiO_xN_x$).

According to one embodiment, the first and second trenches 124, 126 are configured to include a diode. This can be done by appropriately configuring the filler material 130. For example, the filler material 130 can be configured with a junction between two different polysilicon regions having a different doping type and/or concentration. Alternatively, metal can be formed in or above the first and second trenches 124, 126 so as to form a Schottky junction. According to another option, an electrical insulator (e.g., silicon dioxide) is provided between regions of doped filler material 130 to form a PIN diode.

According to another embodiment, the first and second trenches 124, 126 are configured to include a vertical electrical connector. This can be done by filling the first and second trenches 124, 126 with an electrical conductor, such as polysilicon or a metal. As a result, a low resistance path exists between the top and bottom of the first and second trenches 124, 126.

According to another embodiment, the first and second trenches 124, 126 are configured as electrical isolation structures. This can be done by filling the first and second trenches 124, 126 with an electrical insulator, such as silicon dioxide ($SiO_2$), silicon nitride (SiN) or silicon oxynitride ($SiO_xN_x$). As a result, the first and second trenches 124, 126 electrically isolate lateral sections of the type III-V semiconductor layer 104 from one another.

Figure 9:
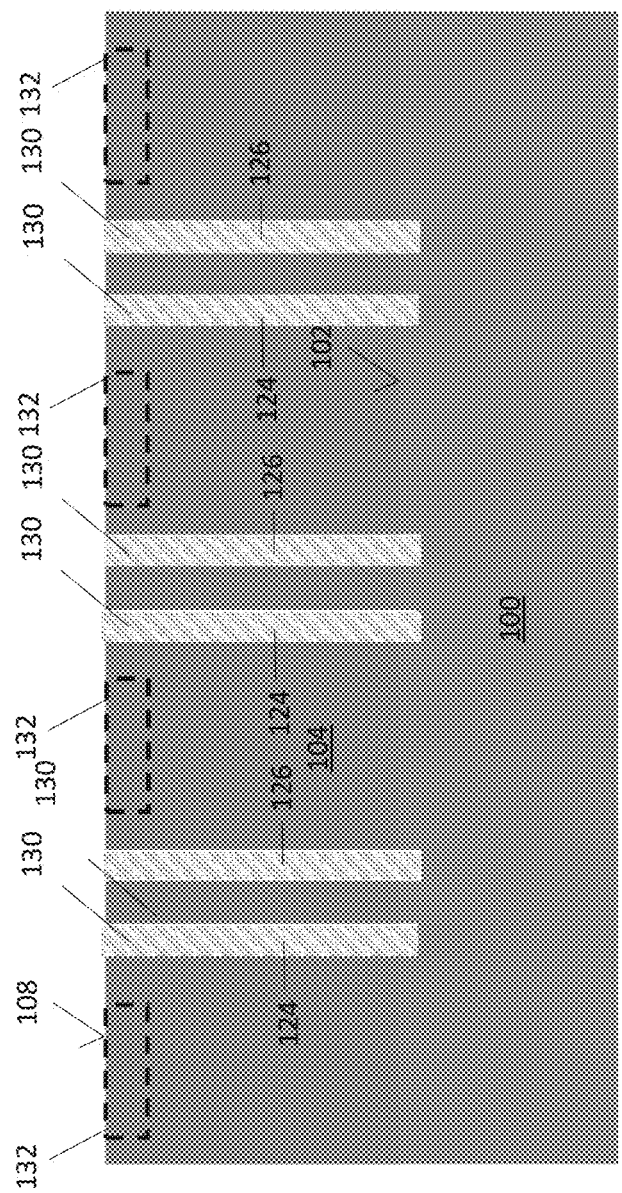
FIG. 9 depicts planarization of the filler material and formation of semiconductor devices in the first type III-V semiconductor layer, according to another embodiment.

Referring to FIG. 9, the filler material 130 has been removed from the upper surface 108 of the type III-V semiconductor layer 104. As a result, the filler material 130 is disposed only in the first and second trenches 124, 126. Removing the filler material 130 may be done using an etchback process or a planarization technique, such as CMP (chemical mechanical planarization). Subsequently, a cleaning process can be performed to remove stray particles from the from the upper surface 108.

After the filler material 130 has been removed from the upper surface 108 of the type III-V semiconductor layer 104, device processing is performed. During device processing, active semiconductor devices, e.g., transistors, diodes, etc. are formed in the type III-V semiconductor layer 104. A location 132 of these active devices is depicted in FIG. 8. Exemplary active device features include input and output terminals, e.g., source, drain, collector, emitter, anode, cathode, etc., control terminals (in the case of transistors), e.g., gate, base etc., contact structures, e.g., source, body contacts, insulating layers, e.g., gate dielectrics, interconnect metallization. Generally speaking, these device processing steps can include a wide variety of known device formation steps, e.g., etching, deposition, doping, masking, etc. Exemplary processing steps include contact formation, e.g., etching and deposition of a conductive material, gate formation, e.g., deposition and structuring of an insulator and gate electrode, interconnect formation, e.g., deposition and etching of dielectric and metallization layers, etc. In the case of a GaN based HEMT, the devices can be configured to control an electrically conductive 2 DEG that is beneath the upper surface 108 of the type III-V semiconductor layer 104 and extends parallel to the upper surface 108. This is just one example, and any of a wide variety of device configurations are possible.

According to some embodiments, elements that are formed in the first and second trenches 124, 126 are electrically connected to the active semiconductor devices. For example, in the case that the first and second trenches 124, 126 are configured with diodes as described above, these diodes can be electrically connected to the active semiconductor devices. In one particular example, an HEMT device is formed in the type III-V semiconductor layer 104 and a diode that is formed in one of the first trenches is connected in parallel with the HEMT device. According to another embodiment, the first and second trenches 124, 126 are used as a vertical electrical connector to provide electrical access to the active semiconductor device at a rear side of the substrate.

Figure 10:
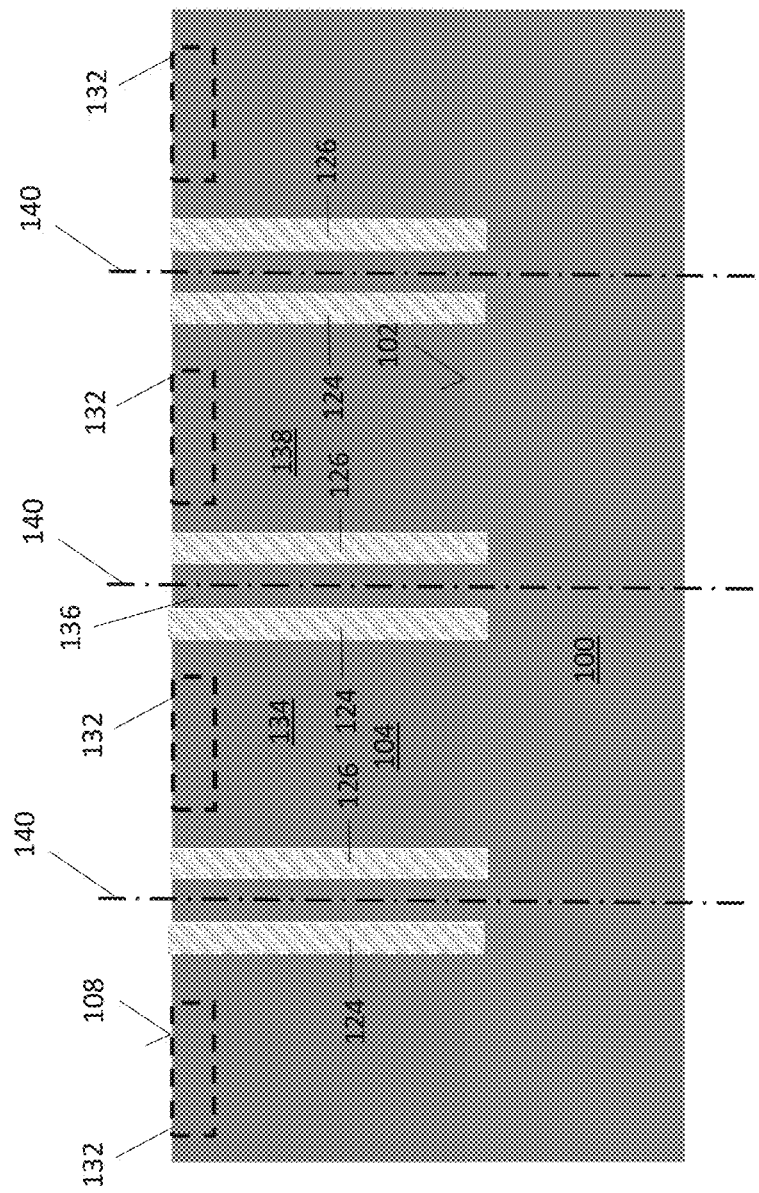
FIG. 10 depicts a sawing line between the first and second trenches, according to an embodiment.

Referring to FIG. 10, after device processing, a cutting process can be performed to separate the wafer into discrete semiconductor chips. From the cross sectional view of FIG. 10, the first and second trenches 124, 126 delineate the type III-V semiconductor layer 104 into various lateral sections. More particularly, for a given set of the first and second trenches 124, 126, a first lateral section 134 is disposed on one side of the first trench 124, a second lateral section 136 is disposed between the first and second trenches 124, 126, and a third lateral section 138 is disposed on one side of the second trench 126. The cut is formed in the second lateral section 136 of the type III-V semiconductor layer 104. The cut is formed along a cutting line 140 that extends through the type III-V semiconductor layer 104 and the base substrate 100. According to an embodiment, the cutting line 140 extends along a plane that is parallel to the first trench length direction 120. That is, the cutting line 140 extends parallel to the first and second trenches 124, 126 from the plan view representation of FIG. 4. Moreover, the cutting line 140 may be perpendicular to the upper surface 108 of the epitaxial layer. A corresponding cut may be formed between intersecting pairs of third and fourth trenches that intersect with the first and second trenches 124, 126. That is, the cuts may be formed in the first and second trench length directions 120, 122 as described with reference to FIG. 4.

The cut may be formed using a mechanical separation technique or a laser separation technique, for example. According to an embodiment, the cut is formed using a mechanical sawing process. In the mechanical sawing process, a saw moves through the substrate along the cutting line 140 that is between the first and second trenches 124, 126.

Figure 11:
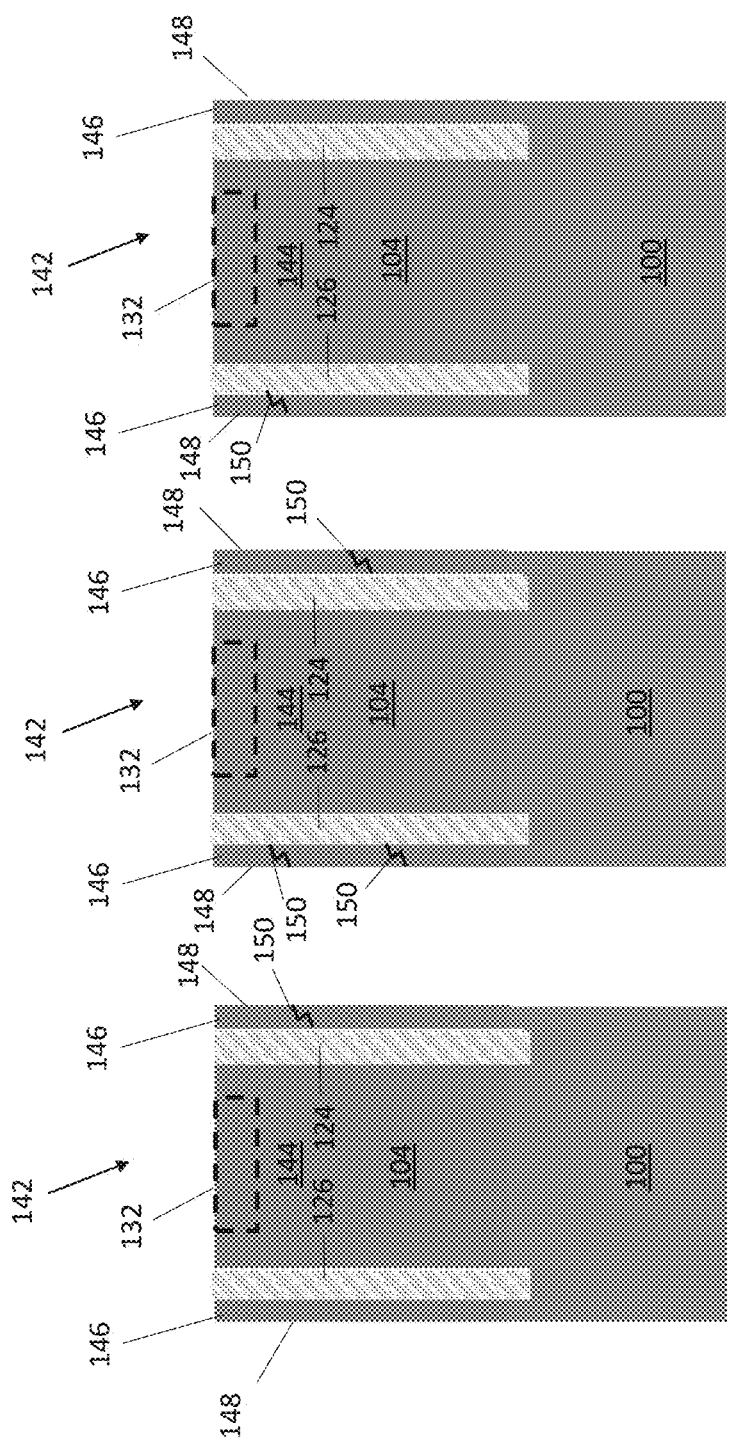
FIG. 11 depicts a plurality of semiconductor chips that are formed by the separation process and have cracks from the singulation process, according to an embodiment.

Referring to FIG. 11, the wafer has been separated into a plurality of discrete semiconductor chips 142 by the above described separation technique. Each of the semiconductor chips 142 contain a set of the first and second trenches 124, 126 that are filled with the filler material 130. FIG. 11 depicts the semiconductor chips 142 from a cross-sectional perspective. According to an embodiment, the semiconductor chips 142 contain a set of the third and fourth trenches that intersect with the first and second trenches 124, 126. As a result, the central lateral section 144 of the type III-V semiconductor layer 104 is completely enclosed by trenches containing the filler material 130. The active devices are contained within these central lateral sections 144. Moreover, the outer lateral sections 146 of the type III-V semiconductor layer 104 that extend to the edge sides 148 of the semiconductor chips 142 are physically decoupled from the central lateral sections 144. As previously explained, the first and second trenches 124, 126 can include elements (e.g., diodes, electrical connectors) that are connected to the active devices.

Due to the separation process, the semiconductor chips 142 contain a number of cracks 150 in the second lateral sections 136. During separation, cracks 150 propagate away from the separation mechanism (e.g., the saw) and towards the central lateral sections 144 of each semiconductor chip 142. As can be seen, the location and number of these cracks 150 can vary from chip to chip. Due to the presence of the first and second trenches 124, 126 that are filled with the filler material 130, the cracks 150 do not reach the active semiconductor devices. That is, the presence of the trenches and the filler material 130 interrupts the crystalline structure of the type III-V semiconductor layer 104 and therefore prevents any crack 150 that forms in the outer lateral sections 146 from extending any further. As a result, any crack that arises during the die separation process is contained within the outer lateral sections 146. Thus, the semiconductor chips 142 remain fully functional as the active devices are not damaged by the cracks 150.

Referring to FIGS. 12-15, a semiconductor wafer rotation technique is depicted. This semiconductor wafer rotation technique can be combined with the methods described with reference to FIGS. 1-11. As will be explained in further detail below, this wafer rotation technique advantageously mitigates the possibility of the substrate cracking or breaking along a cleavage plane.

Figure 12:
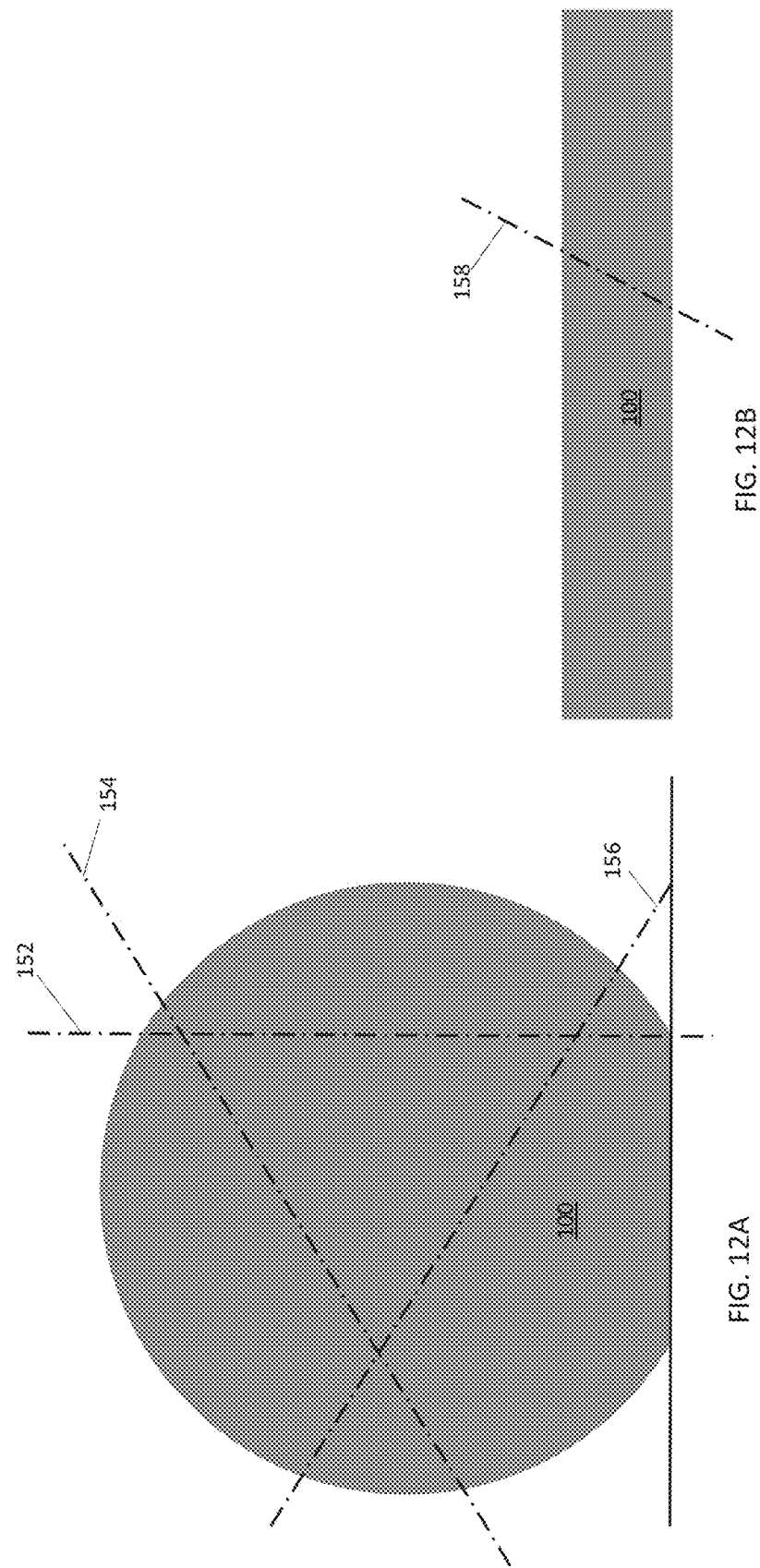
FIG. 12, which includes

Referring to FIG. 12, a plan view and a side view of a semiconductor base substrate 100 is depicted, according to an embodiment. In addition, various crystallographic planes (i.e., lattice places) of the underlying crystalline structure of the semiconductor base substrate 100 are depicted. In the plan view representation of FIG. 12A, the <110> plane 152, the <011> plane 154 and the <101> plane 156 of the semiconductor base substrate 100 are depicted. In the cross sectional view representation of FIG. 12B, the <111> plane 158 of the semiconductor base substrate 100 is depicted.

Due to the mechanical properties of crystal structures, the semiconductor base substrate 100 has a tendency to break more easily along the crystallographic planes than in other directions. That is, the mechanical strength of the substrate varies depending upon how the application of force relates to the crystallographic orientation of the semiconductor material. The semiconductor base substrate 100 shown in FIG. 12 is susceptible to mechanical cleavage along a preferred cleavage plane of the <111> substrate 100 shown in FIG. 12B when the force applied to the substrate aligns with this cleavage plane. From the perspective of FIG. 12A, any force that aligns with the <110> plane 152, the <011> plane 154 or the <101> plane 156 will create a separation force along one of these planes 158. In the context of ordinary semiconductor wafer processing and handling techniques, cleavage of the semiconductor base substrate 100 along one of the preferred cleavage planes of the <111> substrate 100 can be possible due to this phenomena.

In the case of an epitaxial layer grown on the semiconductor base substrate 100, the orientation of the underlying semiconductor base substrate 100 an important role in the mechanical strength of the device. In general, the provision of additional epitaxial layer, such as the type III-V semiconductor layer 104, on the semiconductor base substrate 100 increases the mechanical strength of the device. However, if this additional epitaxial layer includes trenches that are aligned with the <111> cleavage plane, there is a substantial likelihood of cleavage along one of the preferred cleavage planes of the <111> substrate 100. This can lead to partial or complete breakage of the semiconductor base substrate 100, and can require the part to be discarded due to complete device failure.

Figure 13:
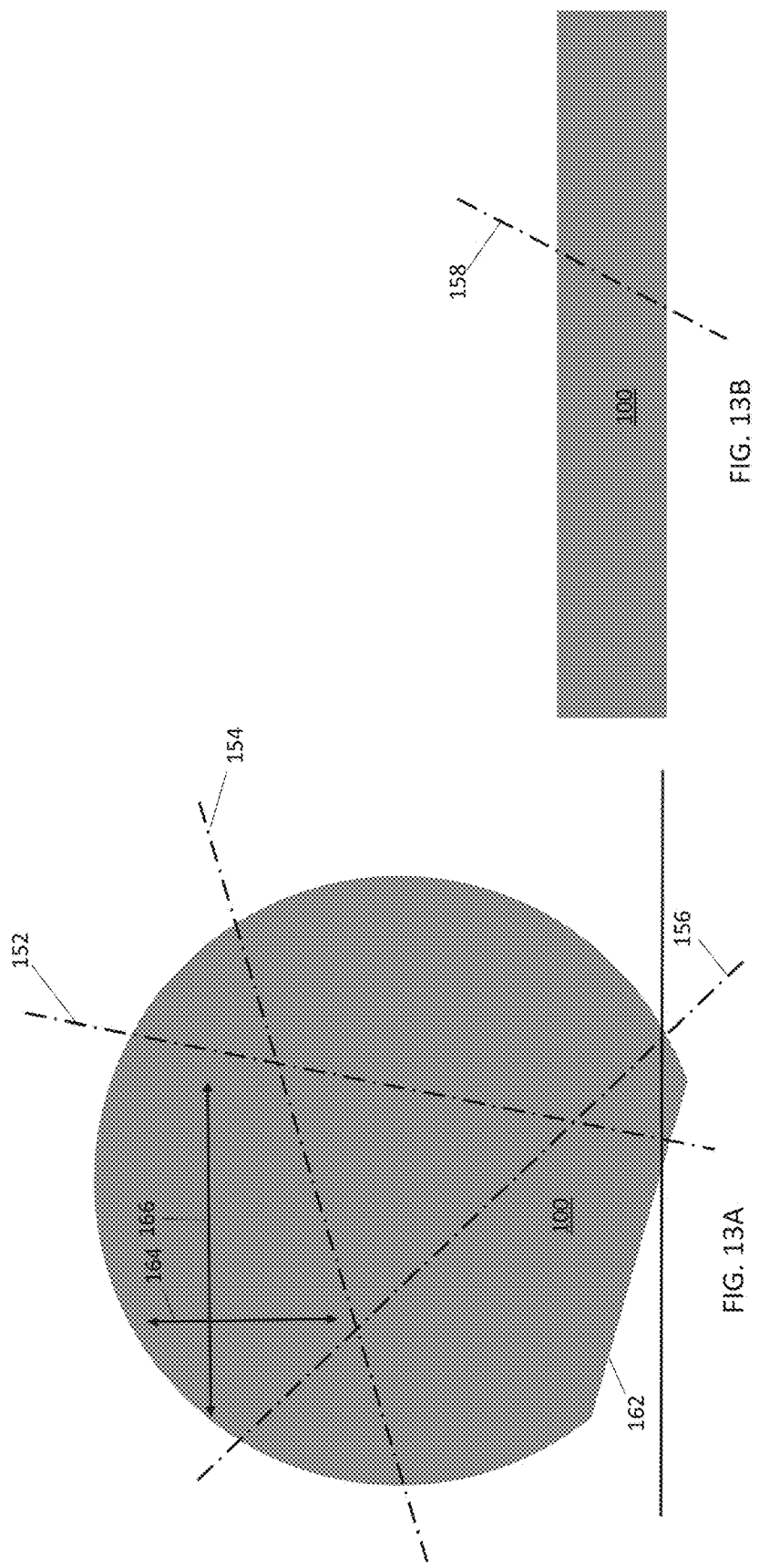
FIG. 13, which includes

Referring to FIG. 13, a method of orienting the semiconductor base substrate 100 prior to epitaxially growing semiconductor material on the semiconductor base substrate 100 and forming trenches therein is depicted. According to the method, an indicator feature 162 that indicates a crystallographic orientation of the semiconductor base substrate 100 is used to determine the crystallographic planes of the semiconductor base substrate 100. The indicator feature 162 can be any physical feature on the semiconductor base substrate 100, such as a notch, alignment mark, irregularity, etc., that enables the user to determine the crystallographic planes of the substrate. In the depicted example, the peripheral edge of the wafer is mostly rounded but includes a flat edge portion that provides the indicator feature 162. According to an embodiment, the flat edge of the substrate, i.e., the indicator feature 162, runs perpendicular to the <110> plane 152. Using this information, the orientation of the <110> plane 152, the <011> plane 154, the <101> plane 156 and the <111> crystallographic plane 158 can be extrapolated.

According to the technique shown in FIG. 13, the semiconductor base substrate 100 is repositioned with one or more trench length formation directions in mind. The trench length formation directions refer a direction that extends parallel to the sidewalls of trenches (i.e., length directions of the trenches) that will eventually be formed in an epitaxial layer that is formed on the semiconductor base substrate 100. In the figure, first and second trench length formation directions 164, 166 are depicted. The first and second trench length formation directions 164, 166 are perpendicular to one another. The indicator feature 162 is used to rotate the semiconductor base substrate 100 prior to epitaxial growth and trench formation. The semiconductor base substrate 100 is rotated in the direction shown such that the trench formation directions are antiparallel to a crystallographic cleavage plane of the substrate. In the depicted example, this is achieved by rotating the substrate such that the <110> plane 152, the <011> plane 154, and the <101> plane 156 of the semiconductor base substrate 100 are antiparallel and anti-perpendicular to first and second trench length formation directions 164, 166. In general, the angle of rotation can be any angle between 0 and 360 degrees other than the exact angles that result in the <110> plane 152, the <011> plane 154, and the <101> plane 156 being parallel or perpendicular to the first and second trench length formation directions 164, 166. Starting from the orientation shown in FIG. 12, the rotation angles that result in the <110> plane 152, the <011> plane 154, and the <101> plane 156 being parallel or perpendicular to the first and second trench length formation directions 164, 166 include rotations of 15°, 30°, 60°, 90°, etc. through each quadrant. Thus, by rotating the substrate by any angle other than these angles, the desired orientation can be achieved. Optionally, a margin of 1-2 degrees can be used (e.g., angles other than 13°-17°, 28°-32°, etc.) to avoid near alignment with a cleavage plane.

Referring to FIG. 14, a first type III-V semiconductor layer 104 is epitaxially formed on the growth surface 102. The first type III-V semiconductor layer 104 can be formed according to the techniques described with reference to FIG. 3.

Referring to FIG. 15, trenches are formed in the first type III-V semiconductor layer 104. The trenches be formed according to any of the techniques described with reference to FIGS. 3-7. According to an embodiment, the trenches are formed such that the first and second trenches 124, 126 as previously described are parallel to the first trench length formation direction 164 and the third and fourth trenches as previously described are parallel to the second trench length formation direction 166. In this way, the first, second, third and fourth trenches are formed to be antiparallel to and antiperpendicular to the <110> plane 152, the <011> plane 154, and the <101> plane 156. As a result, the likelihood that the trenches causing the substrate to break through the <111> plane 158 is substantially reduced. After the formation of the trenches, the trenches can be filled, devices can be formed, and the substrate can be separated into discrete semiconductor chips 142 according to the previously described techniques.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

Spatially relative terms such as "under," "below," "lower," "over," "upper," and the like, are used for ease of description to explain the positioning of one element relative to a second element. These terms are intended to encompass different orientations of the package in addition to different orientations than those depicted in the figures. Further, terms such as "first," "second," and the like, are also used to describe various elements, regions, sections, etc. and are also not intended to be limiting. Like terms refer to like elements throughout the description.

As used herein, the term "lateral," "laterally," and the like refer to a direction that is parallel to the main surface of the substrate. The term "vertical," "vertically," and the like refer to a direction that is perpendicular to the main surface of the substrate. For example, the main surface of the substrate can be mapped to an X, Y axis and the vertical direction can be mapped to the X axis. Features that "extend" in the vertical direction are not necessarily parallel to the vertical direction, but rather have a vector component that is parallel to the vertical direction.

As used herein, the terms "having," "containing," "including," "comprising," and the like are open-ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
   providing a semiconductor base substrate comprising a substantially planar growth surface;
   epitaxially growing a first type III-V semiconductor layer on the growth surface;
   forming first and second trenches that vertically extend from an upper surface of the first type III-V semiconductor layer at least to the growth surface;
   filling the first and second trenches with a filler material that is different from material of the type III-V semiconductor layer; and
   forming a cut that separates the first type III-V semiconductor layer and the base substrate into two discrete semiconductor chips,
   wherein the base substrate comprises an indicator feature that indicates a crystallographic orientation of the substrate,
   wherein the first and second trenches are formed to extend parallel to one another along a first trench length direction,
   wherein the indicator feature is used to orient the substrate prior to formation of the first and second trenchers such that the first trench length direction is antiparallel to a crystallographic cleavage plane of the substrate.

2. The method of claim 1, wherein the first and second trenches are formed to define first, second and third lateral sections of the first layer, the first lateral section being disposed on one side of the first trench, the second lateral section being disposed between the first and second trenches, and the third lateral section being disposed on one side of the second trench, and wherein the cut is formed in the second lateral section.

3. The method of claim 2, wherein forming the cut causes a crack to propagate in the second lateral section, the crack extending away from the cut and reaching the first trench, and wherein the filler material prevents the crack from propagating into the second lateral section.

4. The method of claim 3, wherein forming the cut comprises a mechanical sawing process.

5. The method of claim 1, wherein forming the cut comprises cutting the first type III-V semiconductor layer and the substrate along a first cutting plane that is parallel to the first trench length direction.

6. The method of claim 1, wherein the indicator feature is used to determine the <101>, the <110>, and the <011> crystallographic planes of the base substrate, the method further comprising:
   using the indicator feature to rotate the substrate prior to forming the first and second trenches such that the <101>, the <110>, and the <011> crystallographic planes of the substrate are antiparallel and anti-perpendicular to the first trench length direction of the first and second trenches.

7. The method of claim 1, further comprising:
forming third and fourth trenches that vertically extend from an upper surface of the first type III-V semiconductor layer at least to the growth surface, the third and fourth trenches extending parallel to one another along a second trench length direction that is perpendicular to the first trench length direction; and
using the indicator feature to orient the substrate prior to formation of the first, second, third, and fourth trenchers such that the first and second trench length directions extend along planes that are antiparallel to the crystallographic cleavage plane of the substrate.

8. The method of claim 2, wherein the filler material comprises a polycrystalline semiconductor material.

9. The method of claim 2, wherein the filler material comprises an oxide material.

10. The method of claim 2, further comprising:
forming one or more semiconductor devices in the first lateral section prior to forming the cut.

11. The method of claim 10, wherein filling the first and second trenches with a filler material comprises forming a diode in the first and second trenches, the method further comprising:
connecting the diode to output terminals one of the semiconductor devices.

12. A method of forming a semiconductor device, comprising:
providing a semiconductor base substrate comprising a substantially planar growth surface;
epitaxially growing a first type III-V semiconductor layer on the growth surface;
forming first and second trenches that vertically extend from an upper surface of the first type III-V semiconductor layer at least to the growth surface;
filling the first and second trenches with a filler material that is different from material of the type III-V semiconductor layer; and
forming a cut that separates the first type III-V semiconductor layer and the base substrate into two discrete semiconductor chips,
wherein the first and second trenches are formed to define first, second and third lateral sections of the first layer, the first lateral section being disposed on one side of the first trench, the second lateral section being disposed between the first and second trenches, and the third lateral section being disposed on one side of the second trench,
wherein the cut is formed in the second lateral section, and
wherein filling the first and second trenches with a filler material comprises forming a diode in the first and second trenches.

13. The method of claim 12, further comprising:
forming one or more semiconductor devices in the first lateral section prior to forming the cut.

14. The method of claim 13, further comprising connecting the diode to output terminals one of the semiconductor devices.

15. A method of forming a semiconductor device, comprising:
providing a semiconductor base substrate comprising a substantially planar growth surface;
epitaxially growing a first type III-V semiconductor layer on the growth surface;
forming first and second trenches that vertically extend from an upper surface of the first type III-V semiconductor layer at least to the growth surface;
filling the first and second trenches with a filler material that is different from material of the type III-V semiconductor layer; and
forming a cut that separates the first type III-V semiconductor layer and the base substrate into two discrete semiconductor chips,
wherein forming the cut comprises exclusively cutting semiconductor material.

16. The method of claim 15, wherein after forming the first and second trenches, a second lateral section of the first type III-V semiconductor layer extends continuously between the first and second trenches, and wherein forming the cut comprises cutting semiconductor material from the second lateral section.

* * * * *

UNITED STATES PATENT AND TRADEMARK OFFICE
CERTIFICATE OF CORRECTION

PATENT NO. : 10,256,149 B2
APPLICATION NO. : 15/444386
DATED : April 9, 2019
INVENTOR(S) : A. Zechmann Page 1 of 1

It is certified that error appears in the above-identified patent and that said Letters Patent is hereby corrected as shown below:

In the Claims

At Column 12, Line 36 (Claim 1, Line 23), please change "trenchers" to – trenches –

At Column 13, Line 9 (Claim 7, Line 9), please change "trenchers" to – trenches –

Signed and Sealed this
Twenty-fifth Day of June, 2019

Andrei Iancu
*Director of the United States Patent and Trademark Office*